United States Patent [19]
den Boef

[11] Patent Number: 5,172,059
[45] Date of Patent: Dec. 15, 1992

[54] MAGNETIC RESONANCE METHOD AND DEVICE IN WHICH NONLINEARITIES IN THE RECEIVER ARE COMPENSATED ON AFTER SIGNAL RECEPTION

[75] Inventor: Johannes H. den Boef, Eindhoven, Netherlands

[73] Assignee: U.S. Philips Corp., New York, N.Y.

[21] Appl. No.: 433,638

[22] Filed: Nov. 8, 1989

[30] Foreign Application Priority Data

Nov. 8, 1988 [NL] Netherlands .......................... 8802732

[51] Int. Cl.$^5$ ............................................ G01V 3/00
[52] U.S. Cl. ..................................... 324/307; 324/322
[58] Field of Search ............... 324/307, 309, 318, 322; 128/653 A; 375/11, 12; 341/140

[56] References Cited

U.S. PATENT DOCUMENTS

| | | | |
|---|---|---|---|
| 3,775,685 | 11/1973 | Eggimann et al. | 375/11 |
| 4,703,267 | 10/1987 | Maudsley | 324/307 |
| 4,734,648 | 3/1988 | Machida et al. | 324/322 |
| 4,764,751 | 8/1988 | Kimura | 341/140 |
| 4,766,380 | 8/1988 | Den Boef et al. | 324/309 |
| 4,800,574 | 1/1989 | Tanaka et al. | 341/140 |

FOREIGN PATENT DOCUMENTS

| | | |
|---|---|---|
| 0121466 | 10/1984 | European Pat. Off. . |
| 0165057 | 12/1985 | European Pat. Off. . |
| 0272161 | 6/1988 | European Pat. Off. . |

OTHER PUBLICATIONS

K. Kose et al., "Quantization Noise Reduction by Non-linear Amplitude Compression", Book of Abstracts, Society of Magnetic Resonance in Medicine, Aug. 20–26, 1988, San Francisco, Calif. p. 961.

P. R. Luyten et al, "$^1$H MR Spatially Resolved Spectroscopy of Human Tissues in Situ", Magnetic Resonance Imaging, vol. 4, pp. 237–239, 1986.

A. F. Mehlkopf et al., "A Novel, Simple & High Performance MRI/MRS Transmit/Receive System", Book of Abstracts, Society of Magnetic Resonance in Medicine, Aug. 20–26, 1988, San Franscico, Calif. p. 857.

Primary Examiner—Louis Arana
Attorney, Agent, or Firm—Jack D. Slobod

[57] ABSTRACT

Notably for MR spectroscopy it is important than an MR receiver for resonance signals has a large dynamic range in order to enable the reproduction of comparatively strong as well as comparatively to the weak signals in a spectrum. Therefore, the MR receiver should be linear to a high degree. Otherwise, for example in proton spectra metabolites are liable to be masked by peaks in the spectrum which are caused by harmonic distortion and notably intermodulation distortion. An MR method is proposed for increasing the dynamic range of the MR receiver by software compensation of non-linearities in the MR receiver by means of a counter-distortion function.

11 Claims, 2 Drawing Sheets

MAGNETIC RESONANCE METHOD AND DEVICE IN WHICH NONLINEARITIES IN THE RECEIVER ARE COMPENSATED ON AFTER SIGNAL RECEPTION

BACKGROUND OF THE INVENTION

1. Field of the Invention

The invention relates to a magnetic resonance method, and device where an object which is situated in a steady, uniform magnetic field is exposed to rf electromagnetic pulses in order to obtain magnetic resonance signals which are received and demodulated by means of receiver means, after which the demodulated resonance signals are sampled in order to obtain sampling values wherefrom a nuclear magnetisation spectroscopic and/or spatial distribution is determined. In its particular aspects, the invention relates to compensation of the received resonance signals for distortion in the receiver.

2. Description of the Related Art;

A method and device for mr spectroscopy is known from European Patent Application No. 0.165.057. Even though the receiver will already exhibit a highly linear transfer function in order to prevent excessive deformation of the resonance signals, the linearity error being, for example 1%, residual non-linearity will have a deleterious effect most noticeable for spectroscopy. In (volume-selective) proton spectroscopy where, for example, resonance signals are measured from water and fat of which comparatively large amounts are present in the object, so-called satellite peaks will occur in the spectrum due to non-linear distortion in the receiver means; this becomes manifest as odd-order intermodulation distortion. The satellite signals appear in the spectrum as peaks which are situated on both sides of said water and fat in the present example. When the spectrum contains metabolites (components in an in vivo object wherefrom information is as regards the metabolic condition can be derived) which coincide partly or completely with the satellite signals, the metabolites which may be comparatively weak with respect to the satellite signals are liable to be masked by the satellite signals. In the case of odd-order intermodulation distortion an increase of the non-linearity by a factor x will result in an amplification of the satellite signals by a factor $x^{n-1}$, where n is the order of the intermodulation distortion and x is a number $>0$. Generally, the dynamic range of an MR receiver will amount to some 40 to 50 dB due to non-linearities present, while metabolites are approximately 110 dB weaker than strong signals such as those from water and fat. Therefore, a wide dynamic range is desirable for the receiver means.

SUMMARY OF THE INVENTION

It is an object of the invention to provide a magnetic resonance method and device whereby spectra can be generated and displayed with a wide dynamic range.

To achieve this, a magnetic resonance method in accordance with the invention is characterized in that non-linear distortion of the resonance signals due to distortion introduced by the receiver means which themselves exhibit a substantially linear transfer function is compensated for by distorting the sampled resonance signals by means of a counter-distortion function which counteracts the non-linear distortion. Masking of metabolites by satellite signals is thus strongly reduced. By effecting the compensation after signal sampling, non-linearities in the sampling means are also taken into account. The invention is inter alia based on the idea that disturbing intermodulation products which are liable to mask metabolites in a spectrum or which are capable of causing artefacts in an image can be compensated for by means of compensating "additional" intermodulation products.

It is to be noted that non-linearity compensation is known per se from European Patent Application No. 0.272.161. Therein, a non-linearity correction is performed for a low-frequency quadrupole by means of a non-linear element, such as a photodiode by connecting a multiplier having a variable gain in front of or behind the quadrupole, the gain being adjusted on the basis of a PROM with a function which compensates for the non-linearity. The instantaneous signal strength of the quadrupole is converted, using an A/D converter, into a PROM address, the gain of the multiplier being adjusted on the basis of the PROM contents at the relevant address. This correction does not take into account non-linearities introduced by the A/D converter and the multiplier. Furthermore, because of the A/D conversion required, this compensation is not suitable for rf quadrupoles.

It is to be noted that a compensating analog circuit for non-linearity compensation of an rf amplifier is known from European Patent Application No. 0.121.446, which circuit is connected so as to precede the rf amplifier. Between the signal to be amplified and the amplifier there is connected an amplitude modulator for amplitude modulation of the signal to be amplified by means of a control signal which is derived from the signal to be amplified and from the fed back output signal of the rf amplifier. The analog compensation aims to reduce odd-order intermodulation distortion. The analog circuit is complex and severe requirements are imposed as regards its hardware. Furthermore, because of the additional hardware inter alia the signal-to-noise ratio will deteriorate.

Furthermore, in the abstract "Quantization Noise Reduction by Nonlinear Amplitude Compression", K.Kose et al, Book of Abstracts, SMRM 1988, Aug. 20–26, San Francisco, page 961, after an introduced strong non-linear distortion whereby magnetic resonance signals are distorted a non-linear counter-distortion is applied to the sampled resonance signals. The strong distortion (the square root of the amplitude of the resonance signal is taken according to the cited article) and the subsequent counter-distortion serve to counteract quantising noise problems. The distortion introduced will be known a priori, like the subsequent counter-distortion, for example, square root distortion and quadratic counter-distortion. This method of distortion and counter-distortion is known as compression and expansion and is not suitable for compensating comparatively small non-linear distortions of the receiver means.

A version of a magnetic resonance method in accordance with the invention is characterized in that the counter-distortion function is determined from a number of responses of the receiver means to input signals of predetermined frequency while varying the amplitude. When the distortion of the receiver means has been identified to a given degree, the counter-distortion function can thus be determined. The input signals can be generated by means of a signal generator which is tuned to a predetermined frequency and whose amplitude is varied. The predetermined frequency is, for example the proton frequency and it is assumed that the spread across the frequency range is small or even negligibly small.

A further version of a magnetic resonance method in accordance with the invention is characterized in that the amplitude is varied so that a range of samples is covered with a predetermined discretisation step, the counter-distortion function being determined from the samples in the form of a look-up table. Thus, resonance signals derived from the object can be quickly and accurately compensated as regards linear distortion by the receiver means. Non-linearity in the A/D converter is then also taken into account. The look-up table can be composed as measured signal amplitudes associated with a discretisation step, i.e. the distortion is known for each discretisation step. During the measurement of resonance signals, the digitised resonance signal can serve as an input for the table in order to look up the associated amplitude, and hence compensate for the distortion.

A version of a magnetic resonance method in accordance with the invention is characterized in that the amplitude is varied so that a range of samples is covered for a predetermined number of discretisation steps, a distortion polynomial of the receiver means being determined from the samples. The distortion is thus identified in a coarser manner. Using, for example, a well known polynomial fit procedure, a distortion polynomial can be fitted by the identified points of the transfer function.

A version of a magnetic resonance method in accordance with the invention is characterized in that a distortion polynomial of the receiver means is determined from undesirable peaks in a spectrum of the sampled resonance signal by supplying the receiver means at least with a combination of a first signal having a first frequency and a second signal having a second frequency. In the absence of non-linear distortion (using ideal receiver means) a spectrum determined from the resonance signal generated by the first and the second signal would exhibit two resonance peaks. The resonance signal, however, is subject to non-linear distortion of the receiver means, so that satellite peaks are formed. Beyond a noise level the satellite peaks in the spectrum are looked up. The distortion polynomial is determined by analysis of the satellite peaks.

A further version of a magnetic resonance method in accordance with the invention is characterized in that the counter-distortion function in the form of a look up table is determined from the distortion polynomial. From the distortion polynomial found there is composed a "look-up" table so that in each discretisation step a value of the distortion polynomial is determined.

A further version of a magnetic resonance method in accordance with the invention is characterized in that the counter-distortion function is determined as a counter-distortion polynomial from the distortion polynomial. The coefficients of the counter-distortion polynomial are chosen so that an as large as possible dynamic range is achieved. The coefficients of the counter-distortion polynomial can be stored in memory means of the magnetic resonance device so that measured resonance signals can be counter-distorted by the counter-distortion polynomial.

BRIEF DESCRIPTION OF THE DRAWING

The invention will be described in detail hereinafter with reference to a drawing; therein.

DETAILED DESCRIPTION OF THE PREFERRED EMBODIMENTS

Figure 1A:
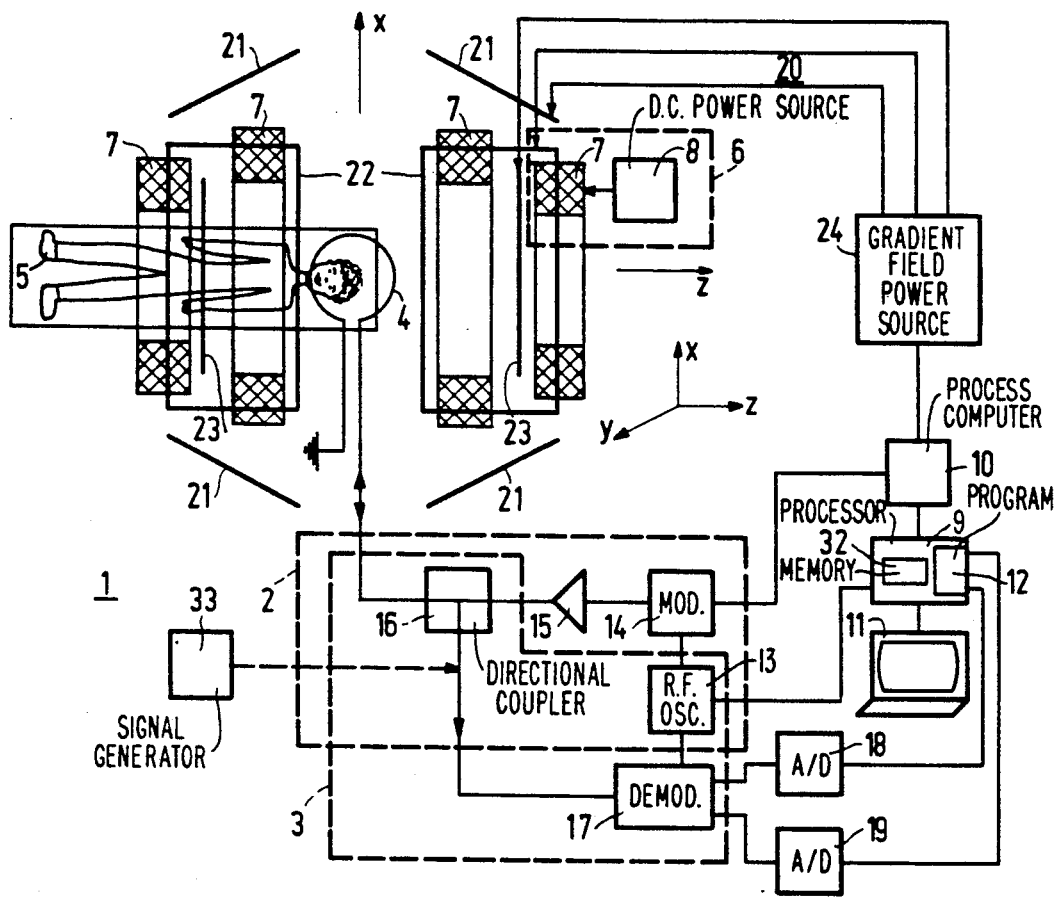
FIG. 1A diagrammatically shows an MR device in accordance with the invention, comprising a first embodiment of transmitter means and receiver means.

FIG. 1A diagrammatically shows an MR device 1 in accordance with the invention, comprising a first embodiment of transmitter 2 and receiver 3 for the transmission of rf electromagnetic pulses, via a transmitter/receiver coil 4, to an object 5 and for receiving magnetic resonance signals which are generated in the object 5 by the rf electromagnetic pulses, which object is situated in a steady, uniform magnetic field. The device 1 comprises means 6 for generating the steady, uniform main magnetic field. The means 6 comprise magnet coils 7 and, in the case of resistive magnets or superconducting magnets, a dc power supply source 8. During operation of the device 1 with the object arranged within the magnet coils 7 a slight excess of nuclear spins (of nuclei having a magnetic moment) will be oriented in the same direction as the steady, uniform field in a state of equilibrium. From a macroscopic point of view this is to be considered as a magnetisation M, being an equilibrium magnetisation. The device 1 also comprises processing means 9 which are coupled to the transmitter means 2 and the receiver means 3, a process computer 10 which is coupled to the processing means 9 and the transmitter means 2, and display means 11 for displaying a nuclear magnetisation distribution which is determined, using programmed means 12, from the resonance signals received by the receiver means and demodulated after signal sampling. Specifically, the transmitter means 2 comprise an rf oscillator 13 for generating a carrier signal, a modulator 14 for amplitude and/or phase or frequency modulation of the carrier signal, a power amplifier 15, and a directional coupler 16 which is coupled to the transmitter/receiver coil 4. The transmitter/receiver coil 4 may be a coil which encloses the entire object 5, or a coil which encloses a part of the object 5, or a surface coil. The rf oscillator 13 is coupled to the processing means 9 and the modulator 14 is coupled to the process computer 10. When excitation pulses having a frequency contents approximately equal to the magnetic resonance frequency of, for example, protons are applied to the object 5 under the control of the programmed means 12 and via the transmitter means 2, magnetic resonance signals will be produced wherefrom a proton spectrum can be determined, using Fourier transformation, by means of the programmed means 12. The receiver means 3 for receiving the resonance signals comprise the directional coupler 16 and a receiver and demodulation unit 17. The unit 17 is, for example a double phase-sensitive detector whose output signals are sampled by means of a first and a second A/D converter 18, 19. The first and the second A/D converter 18, 19 are coupled to the processing means 9. In the case of separate transmitter and receiver coils the directional coupler 16 is absent. The device 1 furthermore comprises means 20 for generating magnetic field gradients which are superposed on the steady, uniform magnetic field. The means 20 comprise gradient magnet coils 21, 22 and 23 for generating magnetic field gradients $G_x$, $G_y$, and $G_z$, respectively, and a power supply source 24 which can be controlled by the process computer 10 in order to power the gradient magnet coils 21, 22 and 23 which are individually controllable. In the embodiment shown, the arrangement in space of the gradient magnet coils is such that the field direction of the magnetic field gradients $G_x$, $G_y$ and $G_z$ coincides with the direction of the steady, uniform magnetic field, the gradient directions extending perpendicularly to one another as denoted in FIG. 1A by three mutually perpendicular axes x, y and z. When pulse and gradient sequences are applied to the object 5, the resonance signals can be used for imaging, volume-selective spectroscopy, or spectroscopic imaging. When no magnetic gradients are applied, resonance signals are obtained from spin nuclei throughout the object. These modes are known per se. For a more general description of an MR device and a general description of the principles of MR, reference is made to the handbook "Practical NMR Imaging" by M. A. Foster and J. M. S. Hutchinson, 1987, IRL Press. The pages 18–22 of said handbook illustrate a pulse and gradient sequence for imaging; the pages 28–38 illustrate an MR device, and page 242 illustrates a pulse and gradient sequence for spectroscopic imaging. For volume-selective spectroscopy reference is made, for example, to the article "$^1$H MR Spatially Resolved Spectroscopy of Human Tissues In Situ" (SPARS), P. R. Luyten and J. A. den Hollander, Magnetic Resonance Imaging, Vol. 4, pp. 237–239, 1986.

Figure 1B:
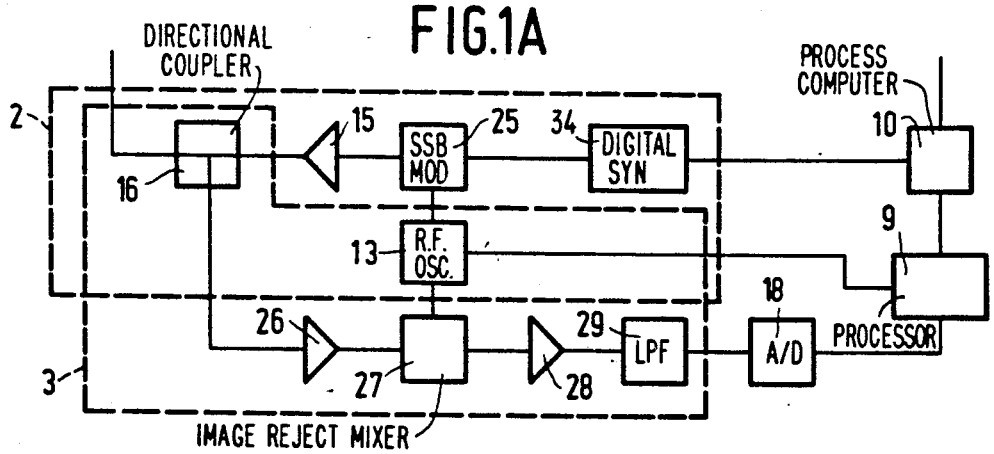
FIG. 1B shows a second embodiment of transmitter means and receiver means suitable for use in the MR device, FIG. 2 diagrammatically shows the receiver means, subdivided into an rf section and an rf/lf section.

FIG. 1B shows a second embodiment of transmitter means and receiver means which are suitable for use in an MR device 1 as described in an abstract: "A novel, simple and high performance MRI/MRS transmit/-receive system" A. F. Mehlkopf and J. H. den Boef, in Book of Abstracts, Vol. 2, SMRM 1988, Aug. 20–26, San Francisco, page 857. For the description of this embodiment the same reference numerals as used in FIG. 1A will be used for corresponding blocks. The transmitter 2 comprises the rf oscillator 13, the power amplifier 15 and the directional coupler 16, like in the first embodiment, and also comprise a digital synthesizer 34 and a single-sideband modulator 25. The receiver means 3 comprises the rf oscillator 13 and the directional coupler 16, like in the first embodiment, and also comprises an rf preamplifier 26, a so-called "image reject mixer" 27, an lf amplifier 28, and a low pass filter 29. The transmitter and receiver of the first embodiment will be referred to hereinafter as a conventional transmitter/receiver, and those of the second embodiment will be referred to as a STRIP transmitter/receiver (Simple Transmitter Receiver with Increased Performance). It is a characteristic feature of the STRIP transmitter/receiver that the demodulated resonance signal occupies a frequency band at one side at a given frequency distance from 0 Hz (for example, a frequency distance of a few kHz). Apart from advantages such as insensitivity to dc drift, the further signal processing does not require quadrature detection like in the conventional transmitter/receiver. The operation is as follows. The single-sideband modulator 25 modulates the frequency of the (phase continuous) digital synthesizer 24 with the frequency of the rf oscillator 13 and an excitation pulse is formed. Via the power amplifier 15, the amplified pulse is applied to the transmitter coil 4 so that a magnetic resonance signal is generated in the object 5. The resonance signal is amplified by the rf preamplifier 26, after which frequency conversion to a low frequency band by the image reject mixer 27 takes place. The image reject mixer 27 ensures that noise at the other side of 0 Hz is negligibly small. The demodulated resonance signal is then amplified by the lf amplifier 28, filtered by the low-pass filter 29 and applied to the A/D converter 18. It is to be noted that image reject mixers are generally known per se.

Figure 2:
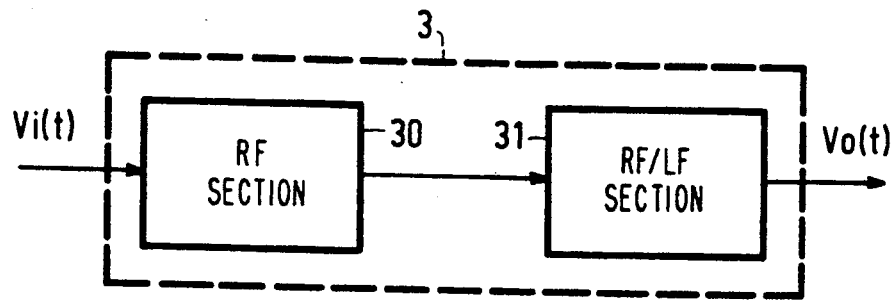

FIG. 2 diagrammatically shows the first or the second embodiment of receiver 3, subdivided into an rf section 30 and an rf/lf section 31 (for example, rf preamplifier and demodulator). The sections 30 and 31 will both exhibit non-linear distortion. In the rf section harmonic distortion will generally not be problematic. For example, in a 1.5 T system in which the proton frequency amounts to approximately 64 MHz, the third-order harmonic will amount to 192 MHz so that it will be situated substantially outside the receiving band of the rf/lf section 31. However, due to intermodulation products undesirable signals may penetrate the frequency band of the magnetic resonance signal. An input signal Vi(t) will be distorted so as to form a distorted output signal Vo(t) by the receiver means 3:

$$Vo(t) = A0 + A1.Vi(t) + A2.Vi(t)^2 + \ldots + An.Vi(t)^n,$$

where A0, A1, ..., An are coefficients and n is an integer. For example, when the signal Vi(t) contains the frequencies $\omega 1$ and $\omega 2$ as the desired frequencies (for example, from an object 5 in the form of a water/fat phantom), harmonics and intermodulation products will occur in the signal Vo(t). For the third order the intermodulation products are $2\omega 1 - \omega 2$ and $2\omega 2 - \omega 1$. For a chemical shift of 3.2 ppm, as exists between water and fat, these third-order intermodulation products will be present in a water/fat spectrum. Orders higher than the third order will generally not make a significant contribution. The relative value of third-order intermodulation products in the spectrum depends on the signal value of Vi(t): an increase of the input signal Vi(t) results in a squarelaw increase of the third order intermodulation distortion peaks in the spectrum. Contrary to the rf section 30, in the rf/lf section 31 even orders may also cause undesirable intermodulation products in the desired frequency band. At the lf side of the rf/lf section 31 harmonic distortion may also be of significance. Undesirable peaks in the spectrum could mask metabolites. In the case of imaging, image artifacts are liable to occur. Said distortions will have a disturbing effect in dependence on the type of transmitter/receiver used. All said distortions will occur in a conventional receiver. In the case of a STRIP receiver, generally only third-order intermodulation products will have a disturbing effect in a protin spectrum, because the other distortions will not penetrate the part of the lf band in which the MR resonance signal is situated. In an embodiment in accordance with the invention, after sampling the output signal Vo(t) is distorted again, by means of a counter-distortion polynomial applied by the programmed arithmetic means 12, so that a substantially non-distorted signal is obtained wherefrom a substantially non-distorted spectrum can be determined by way of Fourier transformation. This embodiment will be described in detail hereinafter, assuming for simplicity that only distortion of the third order is of significance, so that $$Vo(t) = A0 + A1.Vi(t) + A3.Vi(t)^3 \quad (1)$$

m-order counter-distortion results in the signal $$Vc(t) = B0 + B1.Vo(t) + B3.Vo(t)^3 + \ldots + Bm.Vo(t)^m \quad (2)$$

where Vc(t) is the compensated signal and B0, B1, B3, ..., Bm are coefficients yet to be determined, with m odd. The coefficients B0, B1, B3, ..., Bm are determined so that an optimum dynamic range is achieved, so that comparatively weak metabolites in a spectrum can also be distinguished. Generally, m will be larger than the order n of the significant distortion in order to achieve adequate linearity. When a conventional receiver has a dynamic range of, for example from 40 to 50 dB, an increase of the dynamic range by more than 20 dB will be achieved in accordance with the invention. It is desirable to achieve a Vc(t) so that Vc(t) = c.Vi(t), where c is a constant. Substitution of the relation (1) in the relation (2) results in:

$$Vc(t) = B0 + B1 \cdot \{A0 + A1 \cdot Vi(t) + A3 \cdot Vi(t)^3\} + \\ B3 \cdot \{A0 + A1 \cdot Vi(t) + A3 \cdot Vi(t)^3\}^3 + \ldots + \\ Bm \cdot \{A0 + A1 \cdot Vi(t) + A3 \cdot Vi(t)^3\}^m \quad (3)$$

In a suitable approximation for m=3 the relation Vc(t)=c.Vi(t) is satisfied, for example when $B0+B1.A0+A0^3.B3=0$ and $B1.A3=-B3.(A1^3+3.A0^2.A3)$ are chosen. When B1=A1=1 is chosen, it can be simply demonstrated that $B0=-A0+A3.A0^2/(1+3.A0^2.A3)$ and $B3=-A3./(1+3.A0^2.A3)$. The coefficients A0, A1 and A3 representing the transfer of the receiver means 3 are determined, for example on the basis of intermodulation products in a spectrum which is a priori known, such as that of a phantom, or by way of a polynomial analysis of a measured transfer function of the receiver means 3. In the case of a STRIP receiver, generally only odd-order intermodulation products will be of significance. For a conventional receiver, even-order distortion may also be of significance. In that case a polynomial which also contains even-order terms is determined in a manner as described above.

Figure 3A:
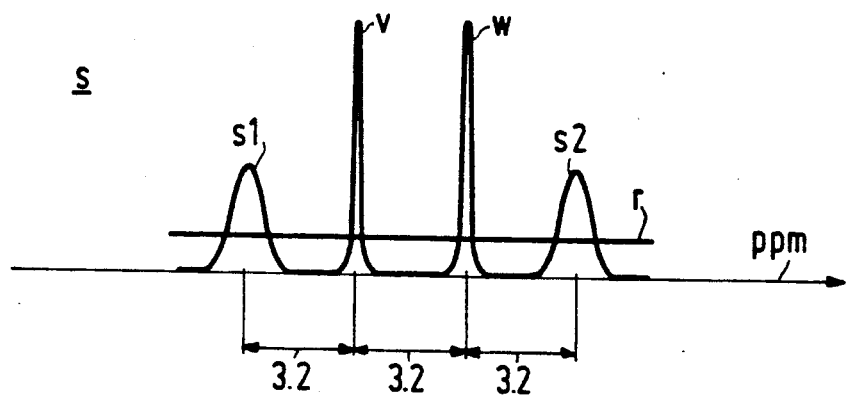
FIG. 3A shows an MR spectrum of an object containing a first and a second type of substance sensitive to spin resonance, which spectrum exhibits resonance peaks caused by third-order intermodulation products.
Figure 3B:
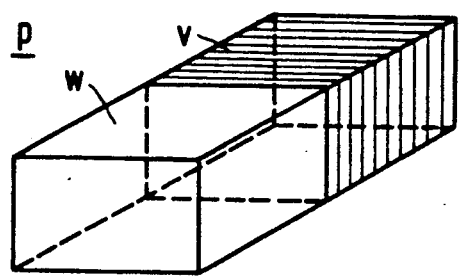
FIG. 3B shows a phantom containing the first and the second type of substance.

FIG. 3A shows an MR spectrum s of an object which contains a first and a second type of substance sensitive to spin resonance, which spectrum exhibits resonance peaks caused by third-order intermodulation distortion. The spectrum s is obtained by Fourier transformation of a resonance signal generated by means of the transmitter means 2 in a water/fat phantom p which is shown in FIG. 3B, which resonance signal has been distorted by the receiver means 3 of, for example, a STRIP transmitter/receiver. The spectrum s exhibits a water peak w at the frequency ω1 and a fat peak at the frequency ω2. The phantom is proportioned so that the water peak and the fat peak are approximately equally strong. FIG. 3B shows a box-shaped phantom filled for 50% with water w and for 50% with fat v. The spectrum s is shown in ppm. The so-called chemical shift between water w and fat v amounts to approximately 3.2 ppm. For a 1.5 T system where the proton frequency amounts to approximately 64 MHz, this means that the shift between water and fat is approximately 200 Hz. The chemical shift is due to the different shielding of protons in water and fat by electrons. The spectrum s shows the satellite signals s1 and s2 caused by third order intermodulation distortion. In the present example the satellite signals s1 and s2 are situated on both sides of water and fat at a distance of 3.2 ppm. When the spectrum of interest has a width of, for example 10 ppm, the intermodulation products will be situated within the spectrum. In the case of the STRIP transmitter/receiver harmonic distortion will not be annoying, but such distortion will be annoying in a conventional receiver. Because the phantom contains only substances of a first and a second type sensitive to spin resonance (water and fat), a non-distorted spectrum will exhibit only a water peak and a fat peak. It is to be noted that it is not objectionable per se that the phantom contains other substances sensitive to spin resonance, for as long as such presence in the spectrum does not cause masking of desired peaks and associated satellite peaks caused by non-linear distortion. In the spectrum s the peaks s1 and s2 beyond a noise level r are looked up. The distortion by the receiver means 3 can be determined from the satellite peaks in that a priori only a water peak and a fat peak are allowed to occur. The phantom supplies a signal Vi(t)=A. cos (ω1.t)+B. cos (ω2.t), in which A and B are yet to be determined from the spectrum s. Assuming that the distortion up to the third order is of significance, $Vo(t)=A0+A1.Vi(t)+A2.Vi(t)^2+A3.Vi(t)^3$. Assuming that use is made of, for example a STRIP receiver, A0 and A2 are not of importance so that A1 and A3 are yet to be determined from the spectrum s. Substitution of Vi(t) in Vo(t) and combination of terms with respective frequencies ω1, ω2, 2ω1−ω2 and 2ω2−ω1 results in coefficients expressed in A, B, A1 and A3. The coefficients correspond to respective surface areas below the measured peaks s1, v, w and s2 in the spectrum s. The coefficients A0, A1 and A3 are determined by solving the equations found. In a conventional receiver also a dc component occurs which could coincide with the water peak. The dc component can be eliminated in known manner before determination of the coefficients A0, A1 and A3. Thus, the dc component can be eliminated by subtracting the resonance signals produced by two measurements carried out with the opposite phase. When the coefficients A0, A1 and A3 (n=3) of the distortion polynomial have been determined, the coefficients B0, B1, B3, ..., Bm of the counter-distortion polynomial are determined in the described manner. The coefficients B0, B1, B3, ..., Bm are stored in memory 32 of the MR device 1 so that each MR resonance signal measured can be counter-distorted by means of the counter-distortion polynomial. The coefficients A0, A1 and A3 of the distortion polynomial of the receiver means 3 are determined in a different manner by measuring the response of the receiver means by means of a signal generator 33 for a number of amplitudes of the input signal Vi(t) and by determining the coefficients A0, A1 and A3 from the measured data by means of a polynomial fitting procedure. Use can be made of a customary fitting procedure such as a least-squares fitting procedure. From the distortion polynomial the counter-distortion function can be determined by means of the programmed arithmetic means 12 so that a counter-distortion value is available for each A/D converter step (for example of a 16-bit A/D converter). The counter-distortion values are then stored in a so-called look up table in the memory means 32. The look-up table can also be designed as a dedicated storage which is coupled to the A/D converter 18 so that the sampled signal has already been compensated for before supply to the processing means 9. The sampled signal determines an address of the dedicated storage and the contents of the dedicated storage are formed by the compensated sampled signal. Each magnetic resonance signal measured can then be counter-distorted by means of a counter-distortion value from the look up table, associated with the measured MR signal, instead of by means of the counter-distortion polynomial. Alternatively, for all A/D steps the response can be determined, using the signal generator, by varying the amplitude of the signal generator which is tuned, for example to the proton frequency, so that the counter-distortion function can be determined by means of the programmed means. In that case the look up table can be completely filled and no polynomials will be required. It is to be noted that for the present state of the art the methods involving the look up table are to be preferred because of the speed of the programmed means 12. As faster signal processors become available, the method utilising the counter-distortion polynomial may become attractive.

I claim:

1. A magnetic resonance method where an object which is situated in a steady, uniform magnetic field is exposed to rf electromagnetic pulses in order to obtain magnetic resonance signals which are received and demodulated by means of receiver means to form at least one time varying demodulated resonance signal, after which each demodulated resonance signal is sampled at successive sampling instants in order to obtain respective successive sampling values wherefrom a nuclear magnetisation distribution is determined, characterized in that non-linear distortion of the resonance signals due to distortion introduced by the receiver means which themselves exhibit a substantially linear transfer function is compensated for by distorting the sampling values obtained from each demodulated resonance signal by applying a counter-distortion function to a sampling value obtained from said demodulated resonance signal which counteracts the non-linear distortion, which counter-distortion function is solely a function of the sampling value to which said counter-distortion function is applied.

2. A magnetic resonance method as claimed in claim 1, characterized in that the counter-distortion function is determined from a number of responses of the receiver means to input signals of predetermined frequency while varying the amplitude of the input signals.

3. A magnetic resonance method as claimed in claim 2, characterized in that the amplitude of the input signals is varied so that a range of samples is covered with a predetermined discretisation step, the counter-distortion function being determined from the samples in the form of a look-up table.

4. A magnetic resonance method as claimed in claim 2, characterized in that the amplitude of the input signals is varied so that a range of samples is covered for a predetermined number of discretisation steps, a distortion polynomial of the receiver means being determined from the samples.

5. A magnetic resonance method where an object which is situated in a steady, uniform magnetic field is exposed to rf electromagnetic pulses from a transmitter in order to obtain magnetic resonance signals which are received and demodulated by means of receiver means, after which the demodulated resonance signals are sampled in order to obtain sampling values wherefrom a nuclear magnetisation distribution is determined, characterized in that non-linear distortion of the resonance signals due to distortion introduced by the receiver means which themselves exhibit a substantially linear transfer function is compensated for by distorting the sampled resonance signals by means of a counter-distortion function which counteracts the non-linear distortion, a distortion polynomial of the receiver means being determined from undesirable peaks in a spectrum of the sampled resonance signal by supplying the receiver means at least with a combination of a first signal having a first frequency and a second signal having a second frequency.

6. A magnetic resonance method as claimed in claim 5, characterized in that the first and the second signal are generated by exciting a phantom representing the object by means of the transmitter, which phantom contains a first and a second type of substance sensitive to spin resonance.

7. A magnetic resonance method as claimed in claim 6, characterized in that the first type of substance is water, the second type of substance being fat.

8. A magnetic resonance method as claimed in claim 5, characterized in that the first and the second signal are generated by means of signal generators.

9. A magnetic resonance method as claimed in claim 4, 5, 6, 7 or 8, characterized in that the counter-distortion function in the form of a look-up table is determined from the distortion polynomial.

10. A magnetic resonance method as claimed in claim 4, 5, 6, 7 or 8, characterized in that the counter-distortion function is determined as a counter-distortion polynomial from the distortion polynomial.

11. A magnetic resonance device comprising means for generating a steady, uniform magnetic field, transmitter means for transmitting rf electromagnetic pulses to an object, receiver means for receiving and demodulating magnetic resonance signals from the object to form one or more time varying demodulated resonance signals, sampling means for generating successive sampling values at respective successive sampling instants from each demodulated resonance signal, and processing means which include programmed arithmetic means for determining a nuclear magnetisation distribution from the sampling values, characterized in that the programmed means also comprises means for compensating for non-linear distortion of the resonance signals due to distortion introduced by the receiver means, themselves having a substantially linear transfer function, by distorting the sampling values generated from each demodulated resonance signal by applying a counter-distortion function to a sampling value generated from said demodulated resonance signal which counteracts the non-linear distortion, which counter-distortion function is solely a function of the sampling value to which said counter-distortion function is applied.

* * * * *